(12) United States Patent
Peng et al.

(10) Patent No.: US 11,451,324 B2
(45) Date of Patent: Sep. 20, 2022

(54) BIT SELECTION FOR HYBRID AUTOMATIC REPEAT REQUESTS

(71) Applicant: ZTE Corporation, Guangdong (CN)

(72) Inventors: Focai Peng, Guangdong (CN); Jun Xu, Guangdong (CN); Jin Xu, Guangdong (CN); Mengzhu Chen, Guangdong (CN); Saijin Xie, Guangdong (CN); Xuan Ma, Guangdong (CN); Cuihong Han, Guangdong (CN)

(73) Assignee: ZTE Corporation, Shenzhen (CN)

( * ) Notice: Subject to any disclaimer, the term of this patent is extended or adjusted under 35 U.S.C. 154(b) by 0 days.

(21) Appl. No.: 17/208,153

(22) Filed: Mar. 22, 2021

(65) Prior Publication Data

US 2021/0211222 A1 Jul. 8, 2021

Related U.S. Application Data

(63) Continuation of application No. PCT/CN2018/108440, filed on Sep. 28, 2018.

(51) Int. Cl.
*H04L 1/00* (2006.01)
*H03M 13/00* (2006.01)

(52) U.S. Cl.
CPC ...... *H04L 1/0013* (2013.01); *H03M 13/6362* (2013.01); *H04L 1/0069* (2013.01)

(58) Field of Classification Search
CPC .............. H04L 1/0013; H04L 1/0069; H03M 13/6362; H03M 13/6306; H03M 13/618; H03M 13/13
See application file for complete search history.

(56) References Cited

U.S. PATENT DOCUMENTS

| | | | | |
|---|---|---|---|---|
| 2008/0320353 A1* | 12/2008 | Blankenship | ......... | H04L 1/0071 714/746 |
| 2010/0058136 A1* | 3/2010 | Lee | ................... | H03M 13/6306 714/752 |
| 2017/0013438 A1* | 1/2017 | Wang | ........................ | H04L 1/00 |
| 2018/0007683 A1* | 1/2018 | You | ........................ | H04L 1/0009 |
| 2019/0013901 A1* | 1/2019 | Nimbalker | ............ | H04L 1/0067 |
| 2019/0246378 A1* | 8/2019 | Islam | ..................... | H04W 72/12 |
| 2020/0021393 A1* | 1/2020 | Noh | ........................ | H04L 1/0057 |
| 2020/0244395 A1* | 7/2020 | Sun | ........................ | H04L 1/0041 |

(Continued)

FOREIGN PATENT DOCUMENTS

| | | |
|---|---|---|
| CN | 102118240 A | 7/2011 |
| CN | 105009541 A | 10/2015 |

(Continued)

OTHER PUBLICATIONS

International Search Report and Written Opinion, PCT/CN2018/10844 dated Jun. 12, 2019, 9 pages.

(Continued)

*Primary Examiner* — Thien Nguyen
(74) *Attorney, Agent, or Firm* — Perkins Coie LLP

(57) ABSTRACT

Methods, systems, and devices related to wireless communication are described. A method of wireless communication includes determining respective starting points of data, in accordance with Polar encoding, that are associated with each Redundancy Version (RV) of a plurality of RVs and selecting data for transmission in accordance with at least one of the plurality of RVs.

19 Claims, 9 Drawing Sheets

(56) References Cited

U.S. PATENT DOCUMENTS

2020/0396027 A1* 12/2020 Zhang .................. H04L 1/18
2021/0329605 A1* 10/2021 Yan .................. H04L 1/1874

FOREIGN PATENT DOCUMENTS

| CN | 108023675 A | 5/2018 |
| EP | 3113387 A1 | 4/2017 |
| WO | 2018/031777 A1 | 2/2018 |
| WO | 2019/099318 A1 | 5/2019 |

OTHER PUBLICATIONS

3GPP TSG RAN WG4 Meeting #84Bis, R4-1710120, Dubrovnik, Croatia, Oct. 9-13, 2017, 18 pages.
NTT Docomo, Inc. 3GPP "Necessity of compact DCI," TSG RAN WG1 Meeting #92bis Sanya, China, Apr. 16-20, 2018, 6 pages.
Partial Search Report, EP 18930334.0, dated Sep. 24, 2021, 13 pages.
Extended Search Report for EP Application No. 18930334.0, dated Jan. 4, 2022, 13 pages.

* cited by examiner

BIT SELECTION FOR HYBRID AUTOMATIC REPEAT REQUESTS

CROSS REFERENCE TO RELATED APPLICATIONS

This patent document is a continuation of and claims benefit of priority to International Patent Application No. PCT/CN2018/108440, filed on Sep. 28, 2018. The entire content of the before-mentioned patent application is incorporated by reference as part of the disclosure of this application.

TECHNICAL FIELD

This patent document is directed generally to wireless communications.

BACKGROUND

Mobile communication technologies are moving the world toward an increasingly connected and networked society. The rapid growth of mobile communications and advances in technology has led to greater demand for capacity and connectivity. Other aspects, such as energy consumption, device cost, spectral efficiency, and latency are also important to meeting the needs of various communication scenarios. In comparison with the existing wireless networks, next generation systems and wireless communication techniques need to support higher data-rates, large number of connections, ultra-low latency, high reliability and other emerging business needs.

SUMMARY

This document relates to methods, systems, and devices related to wireless communication, and more specifically, to hybrid automatic repeat request (HARD) technology.

In one exemplary aspect, a method of wireless communication is disclosed. The method includes determining data for transmission in accordance with at least one of a plurality of RVs, and a starting point of data for transmission is in accordance with Polar encoding associated with the at least one of the plurality of RVs.

In some embodiments, each starting point is defined based on a position of a one-bit RV and the RVs include RV0 and RV1.

In some embodiments, RV0 corresponds to an initial transmission of data and RV1 corresponds to a retransmission of data.

In some embodiments, at least one starting point is defined based on positions of multiple-bits RV.

In some embodiments, the starting point associated with RV0 corresponds to the starting point associated with at least one of Shortening, Puncturing, or repetition. In some embodiments, the Polar encoding is based on Shortening, the starting point of RV1 succeeds the ending point of RV0, and selecting data for transmission in accordance with RV1 includes selecting data in a reverse order of bit number.

In some embodiments, the Polar encoding is based on Shortening and the starting point of RV0 corresponds to the first bit of a code output from the Polar encoding. In some embodiments, the starting point of RV1 corresponds to the (N/2)'th bit of the code output from the Polar encoding, where N is the length of a mother code of the Polar encoding. In some embodiments, the starting point of RV1 corresponds to a mid-point of effective bits of the code output from the Polar encoding. In some embodiments, for a retransmission of data, selecting data for transmission includes selecting, in a circular manner, bits in the code output from the Polar encoding, and the selecting skips one or more bits that are considered deleted in accordance with the Shortening.

In some embodiments, the Polar encoding is based on Puncturing, the starting point of RV1 corresponds to one of the first bit, the (3N/4)'th bit, or the ceil(3E/4)'th bit of a code output from the Polar encoding, and the starting point of RV0 corresponds to the (N−E)'th bit of the code output from the Polar encoding, where N is the length of a mother code of the Polar encoding and E is the number of bits after rate matching.

In some embodiments, the starting point of RV0 corresponds to the first bit of the code output from the Polar encoding and the starting point of RV1 corresponds to the (N/2)'th bit of the code output from the Polar encoding. In some embodiments, the starting point of RV0 corresponds to the first bit of the code output from the Polar encoding and the starting point of RV1 corresponds to one of the ((E−N) mod N)+1)'th bit or the (N/2)'th bit of the code output from the Polar encoding, where E>N.

In some embodiments, for a retransmission of data, selecting data for transmission includes selecting code bits from an output of the Polar encoding that correspond to information input bits. In some embodiments, selecting data for transmission further includes selecting code bits in an ascending order of bit number in accordance with RV1. In some embodiments, selecting data for transmission further includes performing interleaving on the selected code bits. In some embodiments, selecting data for transmission further includes selecting code bits in an order designated by RV1.

In some embodiments, selecting data for transmission includes randomly selecting a set of code bits from an output of the Polar encoding. In some embodiments, selecting the set of code bits is based, at least in part, on m sequence.

In some embodiments, the starting point of RV0 corresponds to the first bit of a code output from the Polar encoding, and the starting point of RV1 corresponds to one of the floor(N*K/E)'th bit, the ceil(N*K/E)'th bit, or the round(N*K/E)'th bit of the code output from the Polar encoding. In some embodiments, if an input bit corresponding to the floor(N*K/E)'th bit of the code output from the Polar encoding is an information bit, then the starting point of RV1 corresponds to the floor(N*K/E)'th bit of the code. In some embodiments, if an input bit corresponding to the ceil(N*K/E)'th bit of the code output from the Polar encoding is an information bit, then the starting point of RV1 corresponds to the ceil(N*K/E)'th bit of the code. In some embodiments, if an input bit corresponding to the round(N*K/E)'th bit of the code output from the Polar encoding is an information bit, then the starting point of RV1 corresponds to the round(N*K/E)'th bit of the code.

In some embodiments, the starting point of RV0 corresponds to the first bit of a code output from the Polar encoding, and the starting point of RV1 corresponds to one of the floor(N*(1−K/E))'th bit or ceil(N*(1−K/E))'s bit of the code output from the Polar encoding. In some embodiments, if an input bit corresponding to the ceil(N*(1−K/E))'th bit of the code output from the Polar encoding is an information bit, then the starting point of RV1 corresponds to the ceil(N*(1−K)/E))'th bit of the code.

In some embodiments, if the code rate (R=K/E) is less than a threshold value R0, then the starting point of RV1 corresponds to one of the floor(E*R0)'th bit or the ceil (E*R0)'th bit of a code output from the Polar encoding. In some embodiments, if the code rate (R=K/E) is less than ½, the starting point of RV1 corresponds to one of the floor(E/2)'th bit or the ceil(E/2)'th bit of a code output from the Polar encoding. In some embodiments, if the code rate (R=K/E) is greater than or equal to ½, the starting point of RV1 corresponds to one of the floor(E/4)'th bit or the ceil(E/4)'th bit of a code output from the Polar encoding. In some embodiments, if K/N<½, the starting point of RV1 corresponds to one of the floor(E/2)'th bit or the ceil(E/2)'th bit of a code output from the Polar encoding. In some embodiments, if K/N>=½, the starting point of RV1 corresponds to one of the floor(E/3)'th bit or the ceil(E/3)'th bit of a code output from the Polar encoding.

In some embodiments, the starting point of RV0 corresponds to an Offset'th bit of a code output from the Polar encoding and the starting point of RV1 corresponds to one of the (floor(N*K/E)+Offset)'th bit or the (ceil(N*K/E)+Offset)'th bit of the code output from the Polar encoding. In some embodiments, the Offset equals one of K, N−K, K/2, or K/4.

In some embodiments, the Polar encoding is based on Shortening, K information bits are appended to E code bits, and the E+K bits are written into a circular buffer of length E+K. In some embodiments, the Polar encoding is based on Shortening, a subset of J information bits selected from a set of K information bits are appended to E code bits, and the E+J bits are placed in a circular buffer of length E+J. In some embodiments, the starting point of RV0 corresponds to the first bit of the E code bits, and the starting point of RV1 corresponds to one of the mid-point of the circular buffer or the last bit of the E code bits. In some embodiments, the plurality of RVs includes four RVs: RV0, RV1, RV2, and RV3, where the starting point of RV0 corresponds to the first bit of the E code bits, the starting point of RV1 corresponds to the first quartile point of the circular buffer, the starting point of RV2 corresponds to the mid-point of the circular buffer, and the starting point of RV3 corresponds to the third quartile point of the circular buffer.

In some embodiments, the Polar encoding is based on Puncturing, K information bits are appended to N code bits, and the N+K bits are placed in a circular buffer of length N+K. In some embodiments, the Polar encoding is based on Puncturing, a subset of J information bits selected from a set of K information bits are appended to N code bits, and the N+J bits are placed in a circular buffer of length N+J. In some embodiments, the starting point of RV0 corresponds to the (N−E)'th bit of the N code bits, and the starting point of RV1 corresponds to one of the mid-point of the circular buffer or the last bit of the N code bits. In some embodiments, the plurality of RVs includes four RVs: RV0, RV1, RV2, and RV3, and the starting point of RV0 corresponds to the (N−E)'th bit of the N code bits, the starting point of RV1 corresponds to the first quartile point of the circular buffer, the starting point of RV2 corresponds to the mid-point of the circular buffer, and the starting point of RV3 corresponds to the third quartile point of the circular buffer. In some embodiments, the K information bits are sorted according to their associated reliability in a corresponding output code after the Polar encoding, and the N+K bits are placed in the circular buffer in accordance with the sorting. In some embodiments, the information bits associated with relatively higher reliability are first placed in the circular buffer. In some embodiments, the reliability associated with the K information bits is sorted from low to high or from high to low according to the bit order of an initial transmission of data. In some embodiments, the reliability associated with the K information bits is sorted from low to high or from high to low according to the bit order of a most recent transmission of data. In some embodiments, before the N+K bits are placed in the circular buffer of length N+K, the K information bits or the N+K bits are sub-block interleaved. In some embodiments, before the N+J bits are placed in the circular buffer of length N+J, the N+J bits are sub-block interleaved.

In some embodiments, first half and second half of a code output from the Polar encoding are XORed to obtain first data of half the length of the code output from the Polar encoding, the first data and at least a part of the code are used to at least partially form new data, and the new data is placed in a circular buffer. In some embodiments, first half and second half of code data previously generated by at least one XOR operation are further XORed to obtain second data of half the length of the code data previously generated by at least one XOR operation. In some embodiments, the code data previously generated by at least one XOR operation is the first data and the second data is appended to the first data, which is appended to the code, to form the new data. In some embodiments, the code output from the Polar encoding has a length of N, the Polar encoding is based on Shortening, and the first data has a length of N/2. In some embodiments, the first data is appended to E bits of the code to form the new data of length E+N/2. In some embodiments, first half and second half of the first data are further XORed to obtain second data of length N/4, and either (a) the second data is appended to E bits of the code to form the new data of length E+N/4 or (b) the first data and the second data are appended to the E bits of the code to form the new data of length E+3N/4. In some embodiments, the code output from the Polar encoding has a length of N, the Polar encoding is based on Puncturing, and the first data has a length of N/2. In some embodiments, the first data is appended to N bits of the code to form the new data of length 3N/2. In some embodiments, first half and second half of the first data are further XORed to obtain second data of length N/4, and either (a) the second data is appended to N bits of the code to form the new data of length 5N/4 or (b) the first data and the second data are appended to the E bits of the code to form the new data of length 7N/4.

In some embodiments, input information bits and code bits of a code output from the Polar encoding are XORed to obtain additional data having a length equal to the length of the input information bits, the additional data is appended to the code output from the Polar encoding to form new data, and the new data is placed in a circular buffer.

In some embodiments, K input information bits and the first K code bits of a code output from the Polar encoding are XORed to obtain additional data having a length of K, the additional data is appended to at least a part of the code output from the Polar encoding to form new data, and the new data is placed in a circular buffer. In some embodiments, the Polar encoding is based on Shortening, the additional data is appended to the first E code bits of the code output from the Polar encoding to form the new data of length K+E, where E is the number of bits after rate matching. In some embodiments, the Polar encoding is based on Puncturing, and the additional data is appended to the N code bits of the code output from the Polar encoding to form the new data of length K+N, where N is the length of mother code for the Polar encoding.

In some embodiments, if a target condition is satisfied, the Polar encoding is based on Puncturing and the starting point of one RV is either (a) one bit after the ending point of another RV or (b) a particular code bit of a code output from the Polar encoding; and if the target condition is not satisfied, the Polar encoding is based on Shortening and the starting point of one RV is one bit after the ending point of another RV. In some embodiments, the target condition includes at least one of (a) the coding rate K/E is less than or equal to a first threshold value or (b) K/N is less than or equal to a second threshold value. In some embodiments, the first threshold value is ½ or 7/16. In some embodiments, the second threshold value is ½. In some embodiments, the starting point of one RV and the ending point of another RV correspond to positions in a circular buffer. In some embodiments, the particular code bit of the code output from the Polar encoding is the first code bit of the code output from the Polar encoding.

In some embodiments, if a target condition is satisfied, the Polar encoding is based on Puncturing and the starting point of one RV is one bit after the ending point of another RV; and if the target condition is not satisfied, the Polar encoding is based on Shortening and the starting point of one RV is one bit after the ending point of another RV. In some embodiments, the starting of RV1 is one bit after the ending point of RV0. In some embodiments, if the code rate K/E is less than or equal to 7/16, the Polar encoding is based on Puncturing and the starting point of RV1 is one bit after the ending point of RV0; and if the code rate K/E is greater than 7/16, the Polar encoding is based on Shortening and the starting point of RV1 is one bit after the ending point of RV0.

In another exemplary aspect, an apparatus for wireless communication that is configured or operable to perform the above-described methods is disclosed.

In yet another exemplary aspect, the above-described methods are embodied in the form of processor-executable code and stored in a computer-readable program medium.

The above and other aspects and their implementations are described in greater detail in the drawings, the descriptions, and the claims.

DETAILED DESCRIPTION

Figure 1:
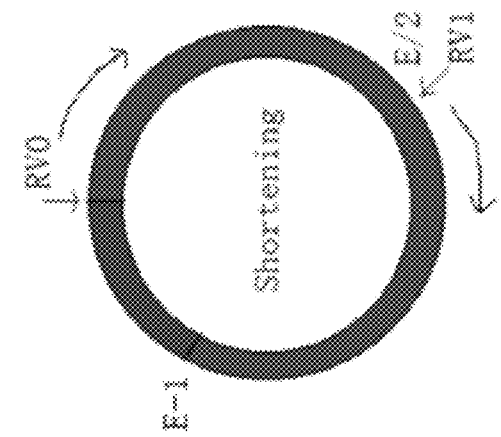
FIG. 1 illustrates a first example of bit selection in accordance with some embodiments of the presently disclosed technology.
Figure 1:
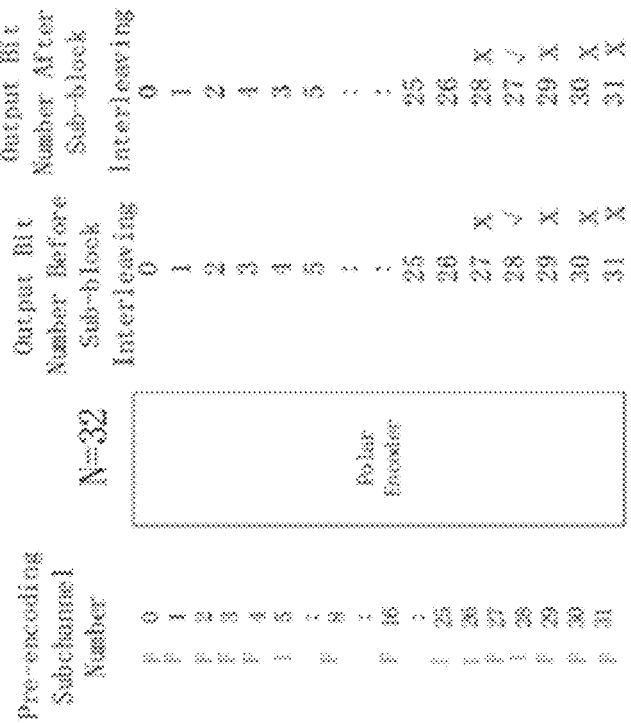

The technology and examples of implementations in this document can be used to improve performance in multi-user wireless communication systems. The term "exemplary" is used to mean "an example of" and, unless otherwise stated, does not imply an ideal or a preferred embodiment. Section headers are used in the present document to facilitate understanding and do not limit the disclosed technology in the sections only to the corresponding section.

In accordance with New Radio (NR) standardization, Polar codes have been applied to the coding of physical downlink control channel (PDCCH), physical broadcast channel (PBCH), and uplink control information (UCI). Currently, the above channels and information do not involve data retransmission and therefore hybrid automatic repeat request (HARQ) is not implemented therewith.

In future NR scenarios, such as machine communication, ultra-reliable low-latency communication, and channels for transmitting substantive data (e.g., physical downlink shared channel (PDSCH) and physical uplink shared channel (PUSCH)), Polar codes may be used as their channel coding scheme. Polar codes may require HARQ technology to facilitate data transmission. However, the 3rd Generation Partnership Project (3GPP) does not have specifications on how to select bits in HARQ when using Polar codes.

Illustratively, various situation can be involved if a base station is to retransmit a block of data (e.g., PDSCH data) after failure of an initial transmission:

The base station transmits a block of self-decodable PDSCH data. In this case, a recipient user equipment (UE) can directly decode the PDSCH data, or if applicable, combine it with previously received transmission(s) and then decode the data.

The base station transmits PDSCH data that cannot be self-decoded. In this case, the UE can only perform combining and decoding. If the previously transmitted (e.g., via initial transmission) data is seriously damaged when received by the UE (e.g., due to low signal to interference & noise ratio (SINR) or large interference), it is possible that the data cannot be decoded even after the combining.

When the base station retransmits a block of data, it may allocate fewer resources than the initial transmission. When there are fewer resources, it may become necessary to specifically select codeword bits for the retransmission.

When the base station transmits a piece of data (either an initial transmission or retransmission), it can select a Redundancy Version (RV) to associate with the transmission for scheduling purposes. In particular, an initial transmission should be self-decodable.

To address the above issues, aspects of the presently disclosed technology are directed to how RVs are defined and how the corresponding codeword bits (and bits after sub-block interleaving) are selected. The presently disclosed technology enables base stations and/or UEs to transmit data based on proper RV selection.

In accordance with Polar codes, K information bits are encoded into a mother code with a length of N bits. The N bits are sub-block interleaved, and then selected into E bits by, for example, Shortening, Puncturing, or repeating, where E is the number of bits after rate matching (also the number of bits provided by the resources used).

Illustratively, the Shortening of Polar code generally refers to situations where the Polar code rate $R=K/E>7/16$. After encoding and sub-block interleaving, the last N−E code bits are deleted (e.g., not transmitted). Here, in some embodiments, the encoding can include sub-block interleaving. More specifically, the K information bits are first encoded by the Polar code to obtain N code bits; then, the N code bits are sub-block interleaved without changing code length, and the last N−E bits are now all zero bits which will not be transmitted.

Illustratively, the Puncturing of Polar code generally refers to situations where Polar code rate $R=K/E≤7/16$. After encoding and sub-block interleaving, the first N−E code bits are deleted (e.g., not transmitted). Here, in some embodiments, the encoding can include sub-block interleaving. Since the N−E code bits are deleted, pre-freezing should be performed on the input bits (or sub-channels) corresponding to the deleted N−E bits. In other words, the values of the corresponding pre-encoding bits are set to known values (e.g., binary 0).

First Embodiment

In some embodiments, illustratively K=21, N=32, E=28, and R=K/E=0.75. In this case, Shortening is performed, and the starting point associated with a first redundancy version RV0 can correspond to the starting point associated with the Shortening. As illustrated in FIG. 1, the first bit number (i.e., starting point) of RV0 corresponds to bit number 0 of the output from sub-block interleaving (i.e., the first bit after Polar code encoding is performed). The code bits to be transmitted corresponding to RV0 are {0, 1, 2, 3, . . . , 25, 26, 27} (28 bits in total). More specifically, after sub-block interleaving of N=32 bits, the last N−E=32−28=4 bits are all 0's which do not need to be transmitted. Therefore, in accordance with RV0, the output bit numbers after sub-block interleaving that are to be transmitted are {0, 1, 2, 3, . . . , 26, 27} (28 bits in total).

As shown in the FIG. 1, illustratively, E/2 is used to specify a second redundancy version RV1, that is, the starting point of RV1 is bit number E/2=28/2=14 of the output from sub-block interleaving. The output bit numbers after sub-block leaving that are to be transmitted in accordance with RV1 are {14, 15, 16, . . . , 26, 27, 0, 1, 2, 3, . . . , 12, 13} (28 bits in total).

Illustratively, if N/2 is used to specify the first bit number of RV1, that is, the starting point of RV1 is bit number N/2=32/2=16 of the output from sub-block interleaving, then the output bit numbers after sub-block leaving that are to be transmitted in accordance with RV1 are {16, . . . , 26, 27, 0, 1, 2, 3, . . . , 12, 13, 14, 15} (28 bits in total).

Second Embodiment

Figure 2:
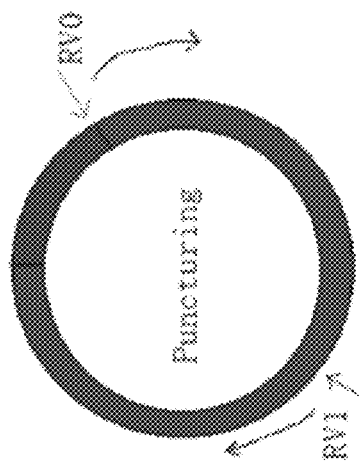
FIG. 2 illustrates a second example of bit selection in accordance with some embodiments of the presently disclosed technology.

In some embodiments, illustratively K=21, N=64, E=60, and R=K/E=0.35. In this case, Puncturing is performed, and the starting point associated with RV0 can correspond to the starting point associated with the Puncturing. As illustrated in FIG. 2, the first bit number (i.e., starting point) of RV0 corresponds to bit number N−E=64−60=4 of the output after sub-block interleaving, that is, the fifth bit of code after Polar code encoding is performed (because bit numbers start from 0). In accordance with RV0, the output bit numbers after sub-block interleaving that are to be transmitted are {4, 5, 6, . . . , 62, 63} (60 bits in total).

As illustrated in FIG. 2, if code rate R=K/E=0.35 is used to specify RV1, then the starting point of RV1 can be bit number floor(N*K/E)=floor(64*0.35)=22 of the output from sub-block interleaving. The output bit numbers after sub-block leaving that are to be transmitted in accordance with RV1 are {22, 23, 24, . . . , 62, 63, 0, 1, 2, 3, . . . , 16, 17} (60 bits in total).

Alternatively, four RVs can be applied. For example, respective starting points of RV0, RV1, RV2, and RV3 can be bit number floor(N−E+N*RV_ID/M), where E is the number of bits after rate matching, N is the length of mother Polar code, RV_ID is 0, 1, 2, or 3 for RV0, RV1, RV2, or RV3 respectively, and M is the total number of RVs (i.e., M=4 here). As the result of that, the starting points of RV0, RV1, RV2, and RV3 are 4, 20, 36, and 52, respectively.

Third Embodiment

In some embodiments, illustratively K=21, N=64, E=60, and R=K/E=0.35. In this case, Puncturing is performed. RV0 can correspond to bit number N−E=64−60=4 of the output after sub-block interleaving, that is, the fifth bit of code after Polar code encoding is performed. In accordance with RV0, the output bit numbers after sub-block interleaving that are to be transmitted are {4, 5, 6, . . . , 62, 63} (60 bits in total).

Illustratively, if the first bit number of RV1 is specified using the code rate R=K/E=0.35, then the starting point of RV1 is bit number ceil(N*(1−K/E))=ceil(64*(1−0.35))=42 of the output after sub-block interleaving. Initially, the output bits after sub-block leaving that are to be transmitted are {42, 43, 44, . . . , 62, 63, 0, 1, 2, 3, . . . , 35, 36, 37} (60 bits in total). That is, the four bits of bit numbers 38, 39, 40, 41 (after sub-block interleaving) are punctured; in other words, the output bit numbers 30, 31, 34, 35 before Polar code encoding are punctured.

Because these two subchannels corresponding to the input bit numbers 30 and 31 before Polar code encoding need to carry user information for transmission, they cannot be punctured. That is, it becomes necessary to first select and keep the output bits (after sub-block interleaving) that correspond to the sub-channels carrying user information. Therefore, instead of puncturing input bit numbers 30 and 31 (before Polar code encoding; numbers 30 and 31 are also the output numbers after Polar encoding), illustratively bit numbers 18 and 19 (before Polar code encoding) are to be punctured because they correspond to subchannels that do not carry user information for transmission. That is, the two bits of bit numbers 32 and 33 (after sub-block interleaving) are to be punctured. As such, the output bit numbers (after sub-block interleaving) in accordance with the final RV1 that are to be transmitted are {42, 43, 44, . . . , 62, 63, 0, 1, 2, 3, . . . , 29, 30, 31, 34, 35, 36, 37, 38, 39} (60 bits in total).

When the two sub-channels 30 and 31 are replaced with two other subchannels (e.g., subchannels 18 and 19 as illustrated above) for Puncturing, sub-channels with high reliability may be selected to replace the two sub-channels 30 and 31. Also, the replacement sub-channels need not be consecutive in their corresponding bit numbers. For example, the two sub-channels 30, 31 can be replaced by two other sub-channels 52 and 23.

Fourth Embodiment

Figure 3:
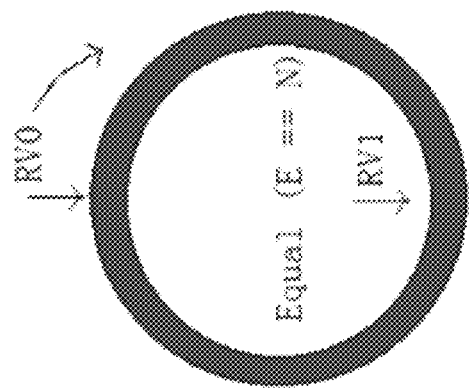
FIG. 3 illustrates a third example of bit selection in accordance with some embodiments of the presently disclosed technology.

In some embodiments, illustratively K=31 and N=E=128. As shown in FIG. 3, RV0 corresponds to bit number 0 of the sub-block interleaved output (i.e., the first bit after Polar code encoding is performed). In accordance with RV0, the output bit numbers after sub-block interleaving that are to be transmitted are {0, 1, 2, . . . , 126, 127} (128 bits in total).

Illustratively, if the first bit number of RV1 is specified using a code E/2 (or N/2), then the starting point of RV1 is bit number 128/2=64 of the sub-block interleaved output (i.e., the 65th bit after Polar code encoding is performed). As shown in FIG. 3, in accordance with RV1, the output bit numbers after sub-block interleaving that are to be transmitted are {64, 65, 66, . . . , 126, 127, 0, 1, 2, . . . , 62, 63} (128 bits in total).

If RV1 is required to use less resources (e.g., only half of the resources corresponding to RV0—that is, E/2), then for RV1, the code bits corresponding to K=31 information bits should be selected first (as well as the corresponding bits after sub-block interleaving), and then code bits corresponding to one or more non-user-information (e.g., pre-frozen) bits should be selected (as well as the corresponding bits after sub-block interleaving) according to the starting point of RV1. Optionally, the selected bits (and the corresponding bits after sub-block interleaving) may be arranged based on their original order (i.e., based on the original bit numbers).

Fifth Embodiment

Figure 4:
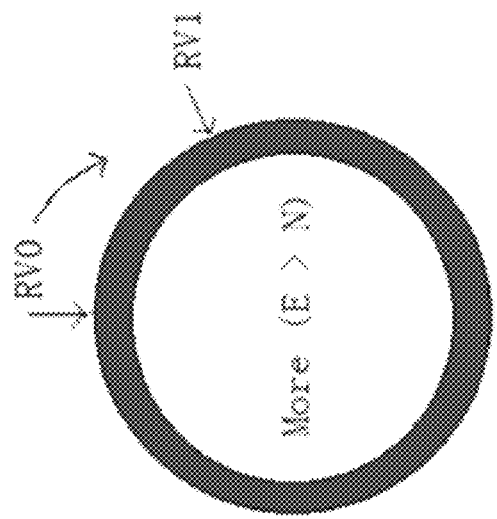
FIG. 4 illustrates a fourth example of bit selection in accordance with some embodiments of the presently disclosed technology.

In some embodiments, illustratively K=31, N=128, and E=140. As shown in FIG. 4, RV0 corresponds to bit number 0 of the sub-block interleaved output (i.e., the first bit after Polar code encoding is performed). In accordance with RV0, the output bit numbers after sub-block interleaving that are to be transmitted are {0, 1, 2, . . . , 126, 127, 0, 1, 2, . . . , 10, 11} (140 bits in total).

As illustrated in FIG. 4, RV1 corresponds to the ((E−N) mod N)+1)=((140−128) mod 128)+1)=13th bit of the Polar code output (i.e., bit number 12 of the Polar code). That is, in accordance with RV 1, the output bit numbers after sub-block interleaving that are to be transmitted are {12, 13, 14, . . . , 126, 127, 0, 1, 2, . . . , 22, 23} (140 bits in total).

Alternatively, RV1 may also be defined as corresponding to floor(K/2)+1=floor(31/2)+1=15+1=16th bit of the Polar output (i.e., bit number 15 after sub-block interleaving). That is, in accordance with RV1, the output bit numbers after sub-block interleaving that are to be transmitted are {15, 16, 17, . . . , 126, 127, 0, 1, 2, . . . , 25, 26} (140 bits in total).

Sixth Embodiment

Figure 5:
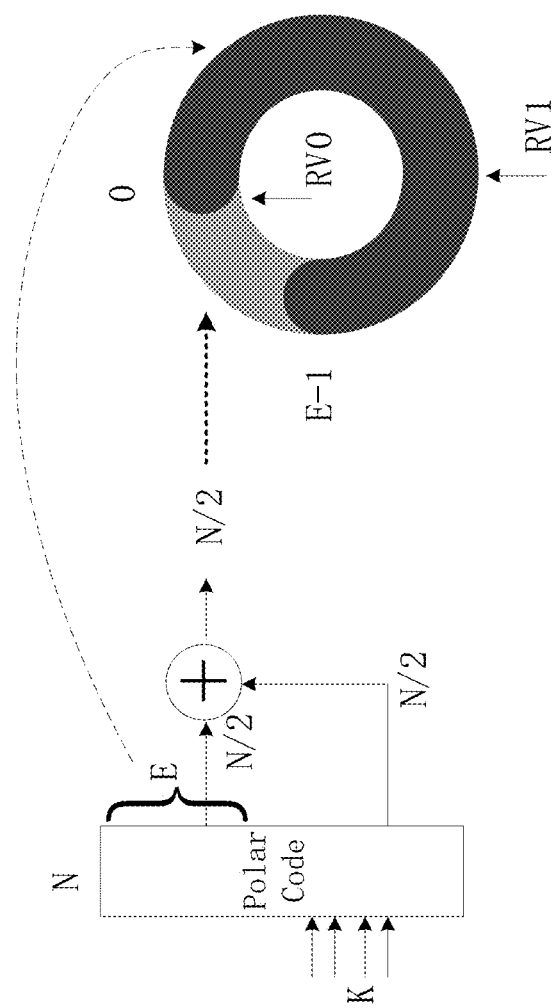
FIG. 5 illustrates a fifth example of bit selection in accordance with some embodiments of the presently disclosed technology.

In some embodiments, illustratively K=21, N=32, and E=28, and the Polar code is generated based on the Shortening method. As shown in FIG. 5, the first half of the Polar code (a total of N/2=16 bits) and the second half of the Polar code (a total of N/2=16 bits) are XORed to obtain additional data (bits) of length N/2=16. The Shortening based Polar code itself outputs E=28 bits of data, because the last N−E=32−28=4 bits after sub-block interleaving the N=32 bits are all 0's and do not need to be transmitted. A part or all of the additional data describe above is appended after the E=28 code bits to obtain new data of length E+N/2=44 (or shorter). Then, this new data of E+N/2=44 (or shorter) is placed into a circular buffer.

As shown in FIG. 5, illustratively the starting point for RV0 is the first bit of the Polar code output (i.e., bit 0; it is also the first bit of the circular buffer), and the data length corresponding to RV0 is E=28, that is, the last bit of RV0 is bit number E−1=27 of the circular buffer. Illustratively, the starting point for RV1 is half the length of the circular buffer, that is, the floor ((E+N/2)/2)=22th bit (i.e., bit number 21). The data length corresponding to RV1 is E=28, that is, the last bit of RV1 is bit number E−floor((E+N/2)/2)−1=5 of the circular buffer. A base station can select RV0 or RV1 to schedule or coordinate with a corresponding terminal.

Seventh Embodiment

Figure 6:
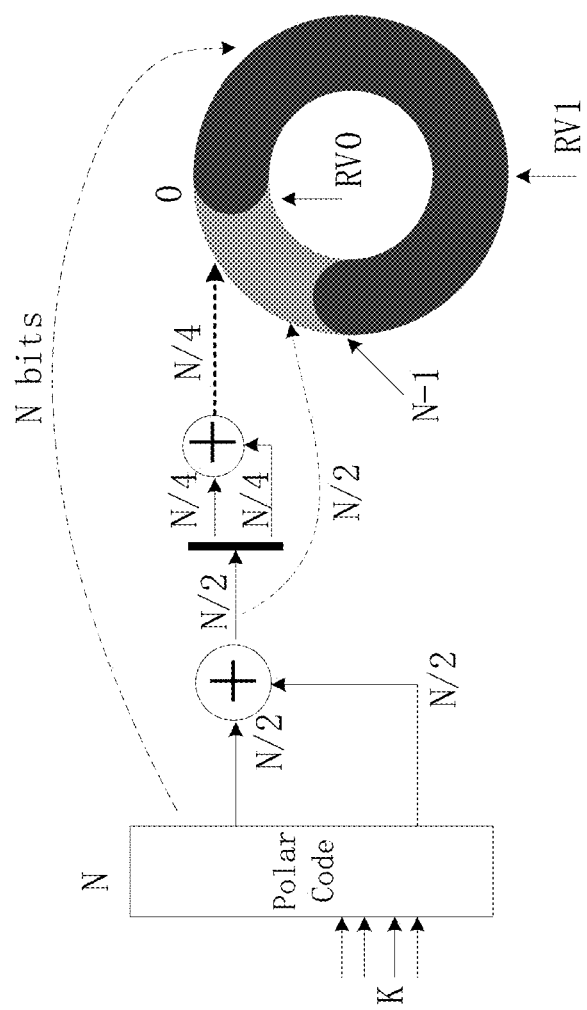
FIG. 6 illustrates a sixth example of bit selection in accordance with some embodiments of the presently disclosed technology.

In some embodiments, illustratively K=10, N=32, and E=28, and the Polar code is generated based on the Puncturing method. As shown in FIG. 6, the first half of the Polar code (a total of N/2=16 bits) and the second half of the Polar code (a total of N/2=16 bits) are XORed to obtain intermediate data (bits) of length N/2=16. Then, the first half and the second half of the intermediate data are XORed to obtain additional data of length N/4=8. The Puncturing based Polar code itself outputs N=32 bits of data (code bits). The N/2=16 intermediate data and the N/4=8 additional data obtained above are then appended to the N=32 code bits to form new data with a length of N+N/2+N/4=N+3N/4=7N/4=56, which is placed into a circular buffer.

Figure 7:
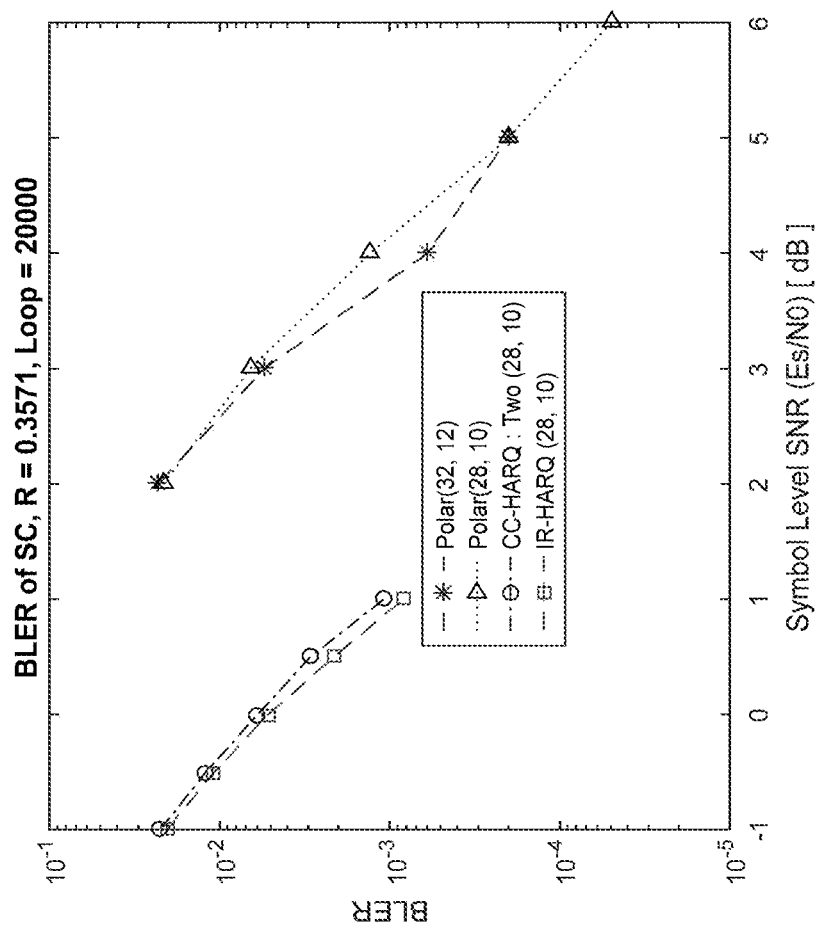
FIG. 7 illustrates examples performance improvement in accordance with some embodiments of the presently disclosed technology.

As shown in FIG. 6, illustratively the starting point for RV0 is the N−E=4th bit of the Polar code output (i.e., bit 3; it is also the fourth bit of the circular buffer), and the data length corresponding to RV0 is E=28, that is, the last bit of RV0 is bit number N−1=31 of the circular buffer. Illustratively, the starting point for RV1 is the next bit after RV0's ending point, that is, the N+1=33th bit of the circular buffer (i.e., bit 32). The data length corresponding to RV1 is E=28, that is, the last bit of RV1 is bit number E−(N/2+N/4)−1=3 of the circular buffer (i.e., the fourth bit of the circular buffer). A base station can select RV0 or RV1 to schedule or coordinate with a corresponding terminal. Illustratively, FIG. 7 shows performance improvement in accordance with these embodiments.

Eighth Embodiment

Figure 8:
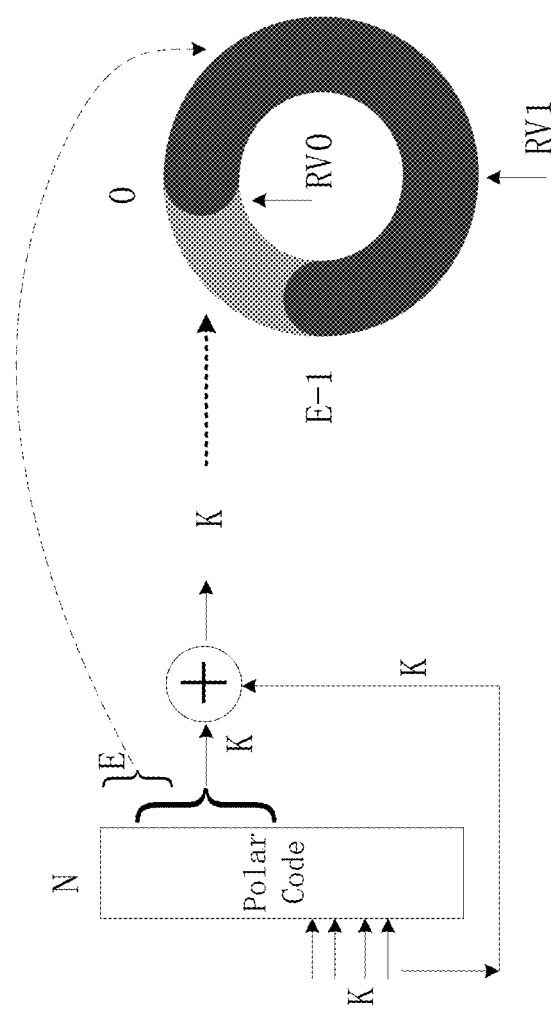
FIG. 8 illustrates a seventh example of bit selection in accordance with some embodiments of the presently disclosed technology.

In some embodiments, illustratively K=21, N=32, and E=28, and the Polar code is generated based on the Shortening method. As shown in FIG. 8, the K=21 input information bits and the first K=21 code bits (numbered 0, 1, 2, . . . , 20) of the Polar code (Shortening based) can be XORed to generate additional data with a length of K=21. The additional data can be appended to the first E=28 bits of the Polar code (after sub-block interleaving) to generate new data of E+K=49 bits. Then the new data can be placed into a circular buffer of length E+K=49 bits. It is noted that the last N−E=32−28=4 bits of code after sub-block interleaving are all 0's, which do not need to be transmitted.

As shown in FIG. 8, illustratively the starting point for RV0 is the first bit of the Polar code output (i.e., bit 0; it is also the first bit of the circular buffer), and the data length corresponding to RV0 is E=28, that is, the last bit of RV0 is bit number E−1=27 of the circular buffer. Illustratively, the starting point for RV1 is half the length of the circular buffer, that is, the floor ((E+K)/2)=24th bit (i.e., bit number 23). The data length corresponding to RV1 is E=28, that is, the last bit of RV1 is bit number E−(E−floor((K+E)/2)+1+K)−1=1 of the circular buffer (i.e., the second bit of the circular buffer). Optionally, the starting point for RV1 can be the (K+E−Offset) bit of the circular buffer (e.g., Offset=1). A base station can select RV0 or RV1 to schedule or coordinate with a corresponding terminal.

Ninth Embodiment

Figure 9:
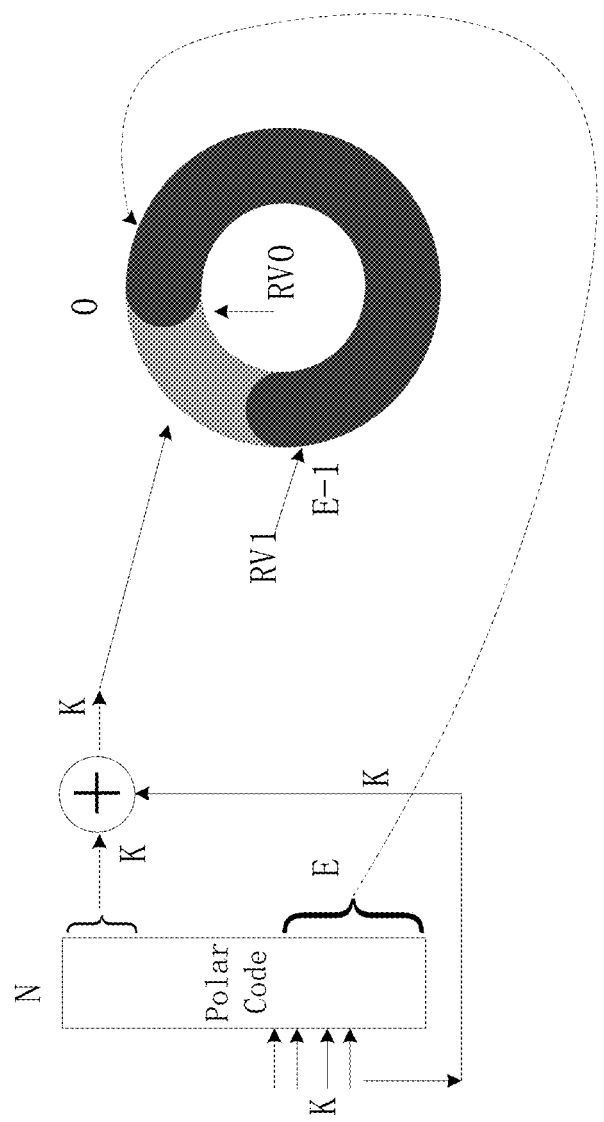
FIG. 9 illustrates an eighth example of bit selection in accordance with some embodiments of the presently disclosed technology.

In some embodiments, illustratively K=10, N=32, and E=28, and the Polar code is generated based on the Puncturing method. As shown in FIG. 9, the K=10 input information bits are XORed with the first K=10 bits (numbered 0, 1, 2, ..., 9) of the Polar code to generate additional data of length K=10. The additional data is appended to the N=32 code bits after the interleaving of the Polar code sub-block to form new data of K+N=42 bits, and then the new data is placed into a circular buffer of K+N=42 bits in length.

As shown in FIG. 9, illustratively the starting point for RV0 is the N−E=4th bit of the Polar code output (i.e., bit 3; it is also the fourth bit of the circular buffer), and the data length corresponding to RV0 is E=28, that is, the last bit of RV0 is bit number N−1=31 of the circular buffer. Illustratively, the starting point for RV1 is the next bit after RV0's ending point, that is, the N+1=33th bit of the circular buffer (i.e., bit 32). The data length corresponding to RV1 is E=28, that is, the last bit of RV1 is bit number E−K−1=17 of the circular buffer (i.e., the 18th bit of the circular buffer). Optionally, the starting point for RV1 can be the (K+N−Offset) bit of the circular buffer (e.g., Offset=2). A base station can select RV0 or RV1 to schedule or coordinate with a corresponding terminal.

Tenth Embodiment

In some embodiments, the input information bit length is K, the length of the mother code of the Polar code is N=32, and the number of bits after rate matching is E. For example, K=10 bits, E=28 bits, and code rate K/E=10/28=0.357. If the threshold of code rate is ½, then the code rate K/E=0.357 is less than the threshold, which satisfies the condition for the Polar code to be generated based on the Puncturing method. Accordingly, the original input information of K=10 bits is encoded into 32-bit code bits; then, the 32-bit code bits are sub-block interleaved, and the 32 output code bits after the sub-block interleaving are written to a circular buffer of N=32 bits.

Based on the above, illustratively there are 2 RVs, one of which starts from the next bit after the ending point of the other RV. For example, the starting point of RV0 is the N−E+1=32−28+1=5th bit of the circular buffer (i.e., bit 4, as numbering starts from 0), and the ending point of RV0 is the N=32th bit of the circular buffer (i.e., bit 31). The starting point of RV1 is one bit after the ending point of RV0, that is, the starting point of RV1 is one bit (i.e., bit 0) after the end point of RV0 (i.e., bit 31), that is, the starting point of RV1 is the first bit of the circular buffer (i.e., bit 0). If the length of RV1 is also E=28 bits, then the ending point of RV1 is the E=28th bit of the circular buffer (i.e., bit 27).

Alternatively or in addition, illustratively there are 2 RVs, one of which has a starting point of a certain code bit of the Polar code. For example, the starting point of RV1 is the floor(N*AB) bit of the circular buffer, where A and B are both positive integers and A<B (e.g., A=3, B=4).

For another example, K=21 bits and E=28 bits, the code rate K/E=21/28=¾. Illustratively, the threshold of the code rate is ½, and the coded code rate of ¾ is greater than the threshold thus does not satisfy the condition for the Polar code to be generated based on the Puncturing method. In this case, the Polar code can be generated based on the Shortening method. That is, the original information input of K=21 bits is encoded into a code of N=32 bits; then, the 32 code bits are sub-block interleaved, and the newly generated 32 code bits after sub-block interleaving are written to a circular buffer with a length of N=32 bits.

Based on the above, illustratively there are 2 RVs, and the starting point of one of the RVs is a certain code bit of the Polar code. For example, the starting point of RV0 is the first bit of the circular buffer (i.e., bit 0), and the ending point of RV0 is the E=28th bit of the circular buffer (i.e., bit 27). The starting point of RV1 is a certain code bit of the Polar code, for example, the N−E+1=32−28+1=5th bit (i.e., bit 4). Since the last N−E=32−28=4 bits of the N=32 bits after the sub-block interleaving are all 0's, the last N−E=4 bits after the sub-block interleaving should be skipped. Then, the ending point of RV1 is the fourth bit of the code after the sub-block interleaving (i.e., bit 3).

Alternatively, the certain code bit of the Polar code can be the first code bit of the Polar code. That is, the starting point of RV1 is the first code bit of the Polar code.

Alternatively, the certain code bit of the Polar code can be a bit of the Polar code that corresponds to the first information bit of the K information bits. Illustratively, for the case of K=21 bits, E=28 bits, and N=32 bits, the first information bit is the sixth sub-channel of the Polar code, and the corresponding code bit is the sixth bit of the Polar code, which is also the sixth code bit after sub-block interleaving. That is, the starting point of RV1 is the sixth bit of code after sub-block interleaving of the Polar code.

Figure 10:
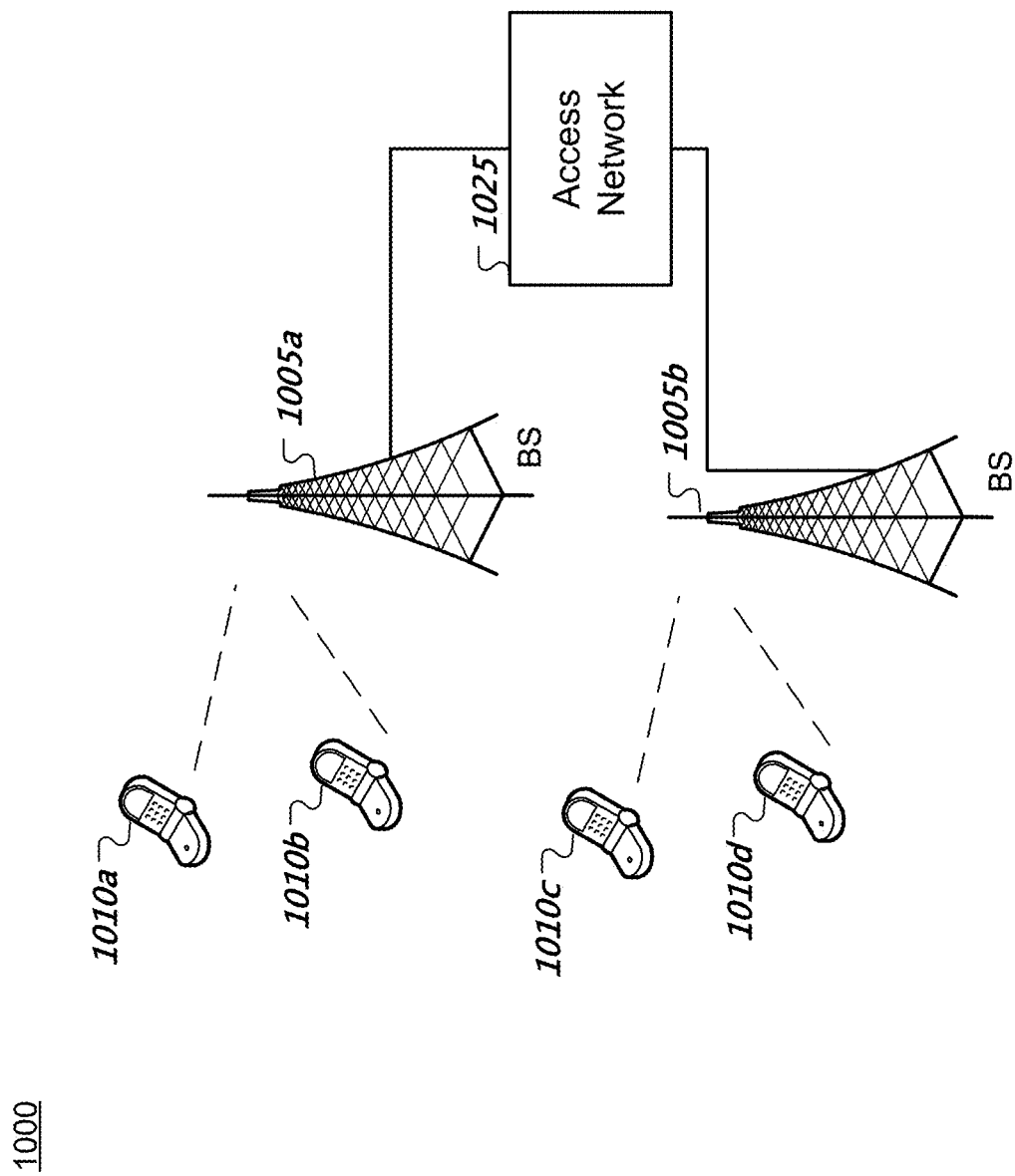
FIG. 10 shows an example of a wireless communication system where techniques in accordance with one or more embodiments of the present technology can be applied.

FIG. 10 shows an example of a wireless communication system where techniques in accordance with one or more embodiments of the present technology can be applied. A wireless communication system 1000 can include one or more base stations (BSs) 1005a, 1005b, one or more wireless devices (e.g., UEs or terminals) 1010a, 1010b, 1010c, 1010d, and an access network 1025. A base station 1005a, 1005b can provide wireless service to wireless devices 1010a, 1010b, 1010c and 1010d in one or more wireless sectors. In some implementations, a base station 1005a, 1005b includes directional antennas to produce two or more directional beams to provide wireless coverage in different sectors.

The access network 1025 can communicate with one or more base stations 1005a, 1005b. In some implementations, the access network 1025 includes one or more base stations 1005a, 1005b. In some implementations, the access network 1025 is in communication with a core network (not shown in FIG. 10) that provides connectivity with other wireless communication systems and wired communication systems. The core network may include one or more service subscription databases to store information related to the subscribed wireless devices 1010a, 1010b, 1010c and 1010d. A first base station 1005a can provide wireless service based on a first radio access technology, whereas a second base station 1005b can provide wireless service based on a second radio access technology. The base stations 1005a and 1005b may be co-located or may be separately installed in the field according to the deployment scenario. The access network 1025 can support multiple different radio access technologies.

In some implementations, a wireless communication system can include multiple networks using different wireless technologies. A dual-mode or multi-mode wireless device includes two or more wireless technologies that could be used to connect to different wireless networks.

Figure 11:
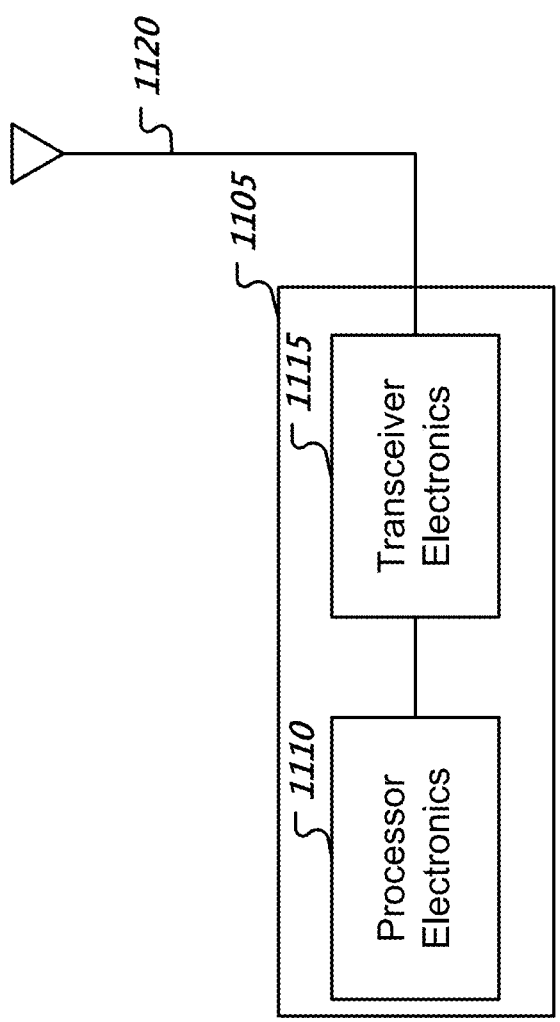
FIG. 11 is a block diagram representation of a portion of a radio station.

FIG. 11 is a block diagram representation of a portion of a radio station. A radio station 1105 such as a base station or a terminal (or UE) can include processor electronics 1110 such as a microprocessor that implements one or more of the wireless techniques presented in this document. The radio station 1105 can include transceiver electronics 1115 to send and/or receive wireless signals over one or more communication interfaces such as antenna 1120. The radio station 1105 can include other communication interfaces for transmitting and receiving data. Radio station 1105 can include one or more memories (not explicitly shown) configured to store information such as data and/or instructions. In some implementations, the processor electronics 1110 can include at least a portion of the transceiver electronics 1115. In some embodiments, at least some of the disclosed techniques, modules or functions are implemented using the radio station 1105.

Some of the embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Some of the disclosed embodiments can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method of wireless communication, comprising:
determining, by a station, starting points of a first redundancy version (RV0) and a second redundancy version (RV1) based on a code rate that is associated with Polar encoding; and
transmitting, by the station, data in accordance with the RV0 and the RV1,
wherein a starting point of data for transmission is in accordance with the Polar encoding associated with the RV0 and the RV1, and
wherein the starting point of the RV1 succeeds an ending point of the RV0 or corresponds to a certain code bit of a code output from the Polar encoding,
wherein the starting point of the RV0 corresponds to a first bit of the code output or a (N−E)'th bit of the code output, and
wherein the certain code bit corresponds to the first bit of the code output or depends on at least one of E, N, or K, whereby N is a length of a mother code of the Polar encoding, E is a number of bits after rate matching, and K is a number of information bits encoded into the mother code.

2. The method of claim 1, wherein the Polar encoding includes performing Shortening of a polar code and wherein the starting point of the RV1 succeeds the ending point of the RV0 or the starting point of the RV0 corresponds to a first bit of the code output from the Polar encoding.

3. The method of claim 1, wherein the Polar encoding includes performing Puncturing of a polar code, the starting point of the RV1 corresponds to one of a first bit, a (3N/4)'th bit, or a ceil(3E/4)'th bit of the code output from the Polar encoding, and the starting point of the RV0 corresponds to a (N−E)'th bit of the code output from the Polar encoding.

4. The method of claim 1, wherein the starting point of the RV0 corresponds to the first bit of the code output from the Polar encoding and the starting point of the RV1 corresponds to i) one of a (N/2)'th bit, a floor(N*K/E)'th bit, a ceil(N*K/E)'th bit, a round(N*K/E)'th bit, floor(N*(1−K/E))'th bit, or ceil(N*(1−K/E))'s bit of the code output from the Polar encoding.

5. The method of claim 1, wherein the starting point of the RV0 corresponds to the first bit of the code output from the Polar encoding and the starting point of the RV1 corresponds to one of a ((E−N) mod N)+1)'th bit or a (N/2)'th bit of the code output from the Polar encoding, wherein E>N.

6. The method of claim 1, wherein the starting point of the RV0 corresponds to the first bit of the code output from the Polar encoding, and the starting point of the RV1 corresponds to one of a floor(N*K/E)'th bit, a ceil(N*K/E)'th bit, or a round(N*K/E)'th bit of the code output from the Polar encoding.

7. The method of claim 2, wherein if the code rate (R=K/E) of the Polar encoding is less than a threshold value R0, then the starting point of RV1 corresponds to one of a floor(E*R0)'th bit or a ceil(E*R0)'th bit of the code output from the Polar encoding.

8. The method of claim 1, wherein if the code rate (R = K/E) of the Polar encoding is less than ½, the starting point of the RV1 corresponds to one of a floor(E/2)'th bit or a ceil(E/2)'th bit of the code output from the Polar encoding, and if the code rate (R=K/E) is greater than or equal to ½, the starting point of the RV1 corresponds to one of a floor(E/4)'th bit or a ceil(E/4)'th bit of the code output from the Polar encoding.

9. The method of claim 1, wherein if K/N<½, the starting point of the RV1 corresponds to one of a floor(E/2)'th bit or a ceil(E/2)'th bit of the code output from the Polar encoding, and if K/N>=½, the starting point of the RV1 corresponds to one of a floor(E/3)'th bit or a ceil(E/3)'th bit of the code output from the Polar encoding.

10. The method of claim 1, wherein the Polar encoding encoding includes performing Shortening of a polar code, K information bits or a subset of J information bits selected from a set of K information bits are appended to E code bits.

11. The method of claim 1, wherein the Polar encoding encoding includes performing Puncturing of a polar code, K information bits or a subset of J information bits selected from a set of K information bits are appended to N code bits.

12. The method of claim 1, wherein first half and second half of the code output from the Polar encoding are XORed to obtain first data of half the length of the code output from the Polar encoding, wherein the first data and at least a part of the code output are used to at least partially form new data, and wherein the new data is placed in a circular buffer.

13. The method of claim 1, wherein input information bits and code bits of the code output from the Polar encoding are XORed to obtain additional data having a length equal to the length of the input information bits, wherein the additional data is appended to the code output from the Polar encoding to form new data, and wherein the new data is placed in a circular buffer.

14. The method of claim 1, wherein the starting of the RV1 is one bit after the ending point of the RV0.

15. The method of claim 1, wherein if the code rate K/E of the Polar encoding is less than or equal to 7/16, the Polar encoding includes performing Puncturing of a polar code and the starting point of the RV1 is one bit after the ending point of the RV0; and wherein if the code rate K/E is greater than 7/16, the Polar encoding includes performing Shortening of the polar code and the starting point of the RV1 is one bit after the ending point of the RV0.

16. A method of wireless communication, comprising:
   determining, by a station, starting points of a first redundancy version (RV0) and a second redundancy version (RV1) based on a code rate that is associated with Polar encoding; and
   transmitting, by the station, data in accordance with the RV0 and the RV1,
   wherein a starting point of data for transmission is in accordance with the Polar encoding associated with the RV0 and the RV1, and
   wherein if a target condition related to the code rate is satisfied, the Polar encoding includes performing Puncturing of a polar code and the starting point of the RV1 is either (a) one bit after an ending point of the RV0 or (b) a certain code bit of a code output from the Polar encoding; and wherein if the target condition is not satisfied, the Polar encoding includes performing Shortening of the polar code and the starting point of the RV1 is one bit after the ending point of the RV0,
   wherein the starting point of the RV0 corresponds to a first bit of the code output or a (N−E)'th bit of the code output, and
   wherein the certain code bit corresponds to the first bit of the code output or depends on at least one of E, N, or K, whereby N is a length of a mother code of the Polar encoding, E is a number of bits after rate matching, and K is a number of information bits encoded into the mother code.

17. The method of claim 16, wherein the target condition includes at least one of (a) the coding rate K/E of the Polar encoding is less than or equal to a first threshold value or (b) K/N is less than or equal to a second threshold value.

18. The method of claim 16, wherein the starting point of the RV1 and the ending point of the RV0 correspond to positions in a circular buffer.

19. A non-transitory computer readable medium having code stored thereon, the code when executed by a processor, causing the processor to implement a method comprising:
   determining starting points of a first redundancy version (RV0) and a second redundancy version (RV1) based on a code rate that is associated with Polar encoding; and
   transmitting, by the station, data in accordance with the RV0 and the RV1,
   wherein a starting point of data for transmission is in accordance with Polar encoding that is associated with the at least one of the plurality of RVs,
   wherein the starting point of the RV1 succeeds an ending point of the RV0 or the starting point of the RV1 corresponds to a certain code bit of a code output from the Polar encoding,
   wherein the starting point of the RV0 corresponds to a first bit of the code output or a (N−E)'th bit of the code output, and
   wherein the certain code bit corresponds to the first bit of the code output or depends on at least one of E, N, or K, whereby N is a length of a mother code of the Polar encoding, E is a number of bits after rate matching, and K is a number of information bits encoded into the mother code.

* * * * *